United States Patent
Bergin et al.

(10) Patent No.: US 10,803,209 B2
(45) Date of Patent: Oct. 13, 2020

(54) TRACKING THE EVOLUTION OF A DESIGN SPACE

(71) Applicant: AUTODESK, INC., San Rafael, CA (US)

(72) Inventors: Michael Bergin, El Cerrito, CA (US); Mark Thomas Davis, Mill Valley, CA (US)

(73) Assignee: AUTODESK, INC., San Rafael, CA (US)

( * ) Notice: Subject to any disclaimer, the term of this patent is extended or adjusted under 35 U.S.C. 154(b) by 638 days.

(21) Appl. No.: 14/951,310

(22) Filed: Nov. 24, 2015

(65) Prior Publication Data

US 2016/0147430 A1    May 26, 2016

Related U.S. Application Data

(60) Provisional application No. 62/084,490, filed on Nov. 25, 2014.

(51) Int. Cl.
*G06F 3/0481* (2013.01)
*G06F 30/20* (2020.01)
(Continued)

(52) U.S. Cl.
CPC ......... *G06F 30/20* (2020.01); *G05B 19/4097* (2013.01); *G06F 16/444* (2019.01);
(Continued)

(58) Field of Classification Search
CPC ...... G05B 19/4097; G05B 2219/49301; G05B 2219/35021; G05B 2219/32089;
(Continued)

(56) References Cited

U.S. PATENT DOCUMENTS

| 5,510,995 A | 4/1996 | Oliver |
| 8,392,160 B2 | 3/2013 | Brincat et al. |

(Continued)

FOREIGN PATENT DOCUMENTS

| CN | 101038599 A | 9/2007 |
| JP | 05081355 A * | 4/1993 |

OTHER PUBLICATIONS

Arieff, A. 2013. New Forms that Function Better. MIT Technology Review http://www.technologyreview.com/review/517596/new-formsthat-function-better/ pp. 1-10.

(Continued)

*Primary Examiner* — Ajay M Bhatia
*Assistant Examiner* — Mong-Shune Chung
(74) *Attorney, Agent, or Firm* — Artegis Law Group, LLP (57) ABSTRACT

A design application includes a design engine and a tracking engine. The design engine allows end-users to create and modify a design space. The design space includes a spectrum of possible design options, as well as other information related to the process of creating designs. When changes are applied to the design space, the design engine transmits event data to the tracking engine that reflects those changes. The tracking engine, based on the event data, updates a design space timeline. The design space timeline illustrates the evolution of the design space over time.

18 Claims, 11 Drawing Sheets

(51) Int. Cl.
    *G05B 19/4097* (2006.01)
    *G06F 16/44* (2019.01)
    *G06T 19/20* (2011.01)

(52) U.S. Cl.
    CPC .... *G06T 19/20* (2013.01); *G05B 2219/32089* (2013.01); *G05B 2219/35012* (2013.01); *G05B 2219/35021* (2013.01); *G05B 2219/49301* (2013.01); *Y02P 80/40* (2015.11)

(58) Field of Classification Search
    CPC ....... G05B 2219/35012; G06F 17/5009; G06F 17/50; G06F 17/30061; G06F 3/04847; G06F 3/0481; G06F 30/00; G06F 30/10; G06F 30/20; G06F 30/3308; G06T 19/20; G06T 15/10; Y02P 80/40
    See application file for complete search history.

(56) References Cited

U.S. PATENT DOCUMENTS

| | | | |
|---|---|---|---|
| 8,589,125 | B2 | 11/2013 | Mori et al. |
| 8,666,702 | B2 | 3/2014 | Schell |
| 8,818,769 | B2 | 8/2014 | Trainer et al. |
| 9,785,727 | B1 | 10/2017 | Wilson |
| 2003/0210241 | A1 | 11/2003 | Minami et al. |
| 2005/0038821 | A1 | 2/2005 | Wallen et al. |
| 2006/0058985 | A1 | 3/2006 | Arslan et al. |
| 2006/0066609 | A1 | 3/2006 | Iodice et al. |
| 2007/0078634 | A1* | 4/2007 | Krishnapillai .......... G06F 17/50 703/1 |
| 2007/0118243 | A1 | 5/2007 | Schroeder et al. |
| 2008/0222110 | A1 | 9/2008 | Hayashi |
| 2008/0319928 | A1 | 12/2008 | Hashimoto et al. |
| 2009/0306801 | A1 | 12/2009 | Sivak et al. |
| 2013/0170171 | A1 | 7/2013 | Wicker et al. |
| 2013/0233618 | A1 | 9/2013 | Nakano et al. |
| 2014/0108953 | A1 | 4/2014 | Greene et al. |
| 2015/0099059 | A1 | 4/2015 | Harjee et al. |
| 2015/0324489 | A1* | 11/2015 | Onodera ............. G06F 17/5086 703/1 |
| 2015/0339307 | A1* | 11/2015 | Hultgren ............... G06F 3/0481 707/724 |
| 2015/0356207 | A1* | 12/2015 | Reitman ............. G06F 17/5095 703/1 |
| 2015/0362898 | A1 | 12/2015 | Potter |

OTHER PUBLICATIONS

Bertini, E., Dell'Aquila, L., & Santucci, G. 2005. "SpringView: cooperation of radviz and parallel coordinates for view optimization and clutter reduction". In Coordinated and Multiple Views in Exploratory Visualization. (8 pages).
Draper, G., Livnat, Y., & Riesenfeld, R. F. 2009. "A survey of radial methods for information visualization". In Visualization and Computer Graphics. pp. 1-45.
Dunne, C. and Shneiderman, B. 2013. "Motif simplification: improving network visualization readability with fan, connector, and clique glyphs". In Proc CHI '13 (14 pages).
Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.
Flager F, Welle B, Bansal P, Soremekun G, Haymaker J. 2009. "Multidisciplinary process integration and design optimization of a classroom building". Journal of Information Technology in Construction, vol. 14. 595-612.
Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium on Simulation for Architecture and Urban Design, Society for Computer Simulation International. (pp. 23-30).
Graham, M., & Kennedy, J. 2003. "Using curves to enhance parallel coordinate visualisations". In Information Visualization, 2003.
Grossman, T., Matejka, T. and Fitzmaurice, G. 2010. "Chronicle: capture, exploration, and playback of document workflow histories". In Proc UIST '10. (pp. 143-152).
Hauser, H., Ledermann, F., & Doleisch, H. 2002. "Angular brushing of extended parallel coordinates". In Information Visualization, 2002. (4 pages).
Holzer, D., Hough, R. and Burry, M. 2007. "Parametric Design and Structural Optimisation for Early Design Exploration". International, Journal of Architectural Computing, vol. 5, 4. 625-643.
Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.
Maile, T., Fischer, M., Bazjanac, V. 2007. "Building energy performance simulation tools—a life-cycle and interoperable perspective". Working Paper. Center for Integrated Facility Engineering, Stanford University. (47 pages).
Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.
Shah, J., Vergas-Hernandez, N., Smith, S. 2003. "Metrics for measuring ideation effectiveness". Design Studies vol. 24. 111-134.
Shneiderman, B. 1996. "The eyes have it: A task by data type taxonomy for information visualizations". In Proc. of IEEE Symposium on Visual Languages. (pp. 336-343).
Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.
Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).
Strauss, A. and Corbin, J. 1998. "Basics of qualitative research: Techniques and procedures for developing grounded theory". Thousand Oaks, CA: Sage. (133 pages).
Terry, M., Mynatt, E.D., Nakakoji, K., and Yamamoto, Y. 2004. "Variation in element and action: supporting simultaneous development of alternative solutions". In Proc CHI '04 (pp. 711-718).
Thibodeau, T. 2013. "U.S. makes a Top 10 supercomputer available to anyone who can 'boost' America". In www.computerworld.com.
Ward, M. O. 1994. "Xmdvtool: Integrating multiple methods for visualizing multivariate data". In Proc. of the Conference on Visualization. (9 pages).
Ward, M. O. 2002. "A taxonomy of glyph placement strategies for multidimensional data visualization". Information Visualization. (pp. 194-210).
Wegman, E. J. 1990. "Hyperdimensional data analysis using parallel coordinates". Journal of the American Statistical Association. (pp. 664-675).
Wong, P. C., & Bergeron, R. D. 1994. "30 Years of Multidimensional Multivariate Visualization". In Scientific Visualization. (pp. 1-30).
Non-Final Office Action received in U.S. Appl. No. 14/951,297, dated Dec. 9, 2019, 30 pages.
Non-Final Office Action received in U.S. Appl. No. 14/951,338, dated Dec. 11, 2019, 32 pages.
Final Office Action received in U.S. Appl. No. 14/951,349, dated Oct. 24, 2019, 23 pages.
Non-Final Office Action received in U.S. Appl. No. 14/951,366, dated Nov. 12, 2019, 23 pages.
Final Office Action received for U.S. Appl. No. 14/951,297, dated Apr. 22, 2020, 17 pages.

* cited by examiner

TRACKING THE EVOLUTION OF A DESIGN SPACE

CROSS-REFERENCE TO RELATED APPLICATIONS

This application claims the benefit of U.S. provisional patent application titled "Dreamcatcher: Approaches for Design Variation," filed on Nov. 25, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to tracking the evolution of a design space.

Description of the Related Art

In a typical engineering workflow, a group of engineers makes a series of design choices based on certain design criteria. As the engineers make each design choice, the spectrum of possible designs is narrowed until just a handful of feasible designs remains. At some later point in time, the engineers may wish to re-create the design process that led to those feasible designs. However, information concerning that process is usually not available or properly documented for various reasons.

For example, different groups of engineers working on the same project could be geographically dispersed, so design choices made by one group of engineers might not be directly available to another group of engineers. Further, certain groups of engineers could have different record-keeping practices compared to other groups of engineers. Consequently, when an engineering project eventually arrives at a finalized design, determining exactly how that design was created becomes quite difficult, since the exact sequence of design choices across the different groups of engineers is unavailable.

As the foregoing illustrates, what is needed in the art is a more effective approach to tracking and memorializing the evolution of a design process.

SUMMARY OF THE INVENTION

Various embodiments of the present invention sets forth a non-transitory computer-readable medium storing program instructions that, when executed by a processor, cause the processor to generate a design space timeline, by performing the steps of generating a first node that indicates a first set of modifications made to a design space at a first point in time, integrating the first node into the design space timeline, and generating a first visual representation of the design space timeline that illustrates one or more modifications of the design space between an initial state and a first state, wherein the first state reflects the first set of modifications.

At least one advantage of the disclosed approach is that the tracking engine records the overall process of generating a successful design. Thus, end-users can analyze the process of creating a successful design, and then implement a similar process to create other successful designs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
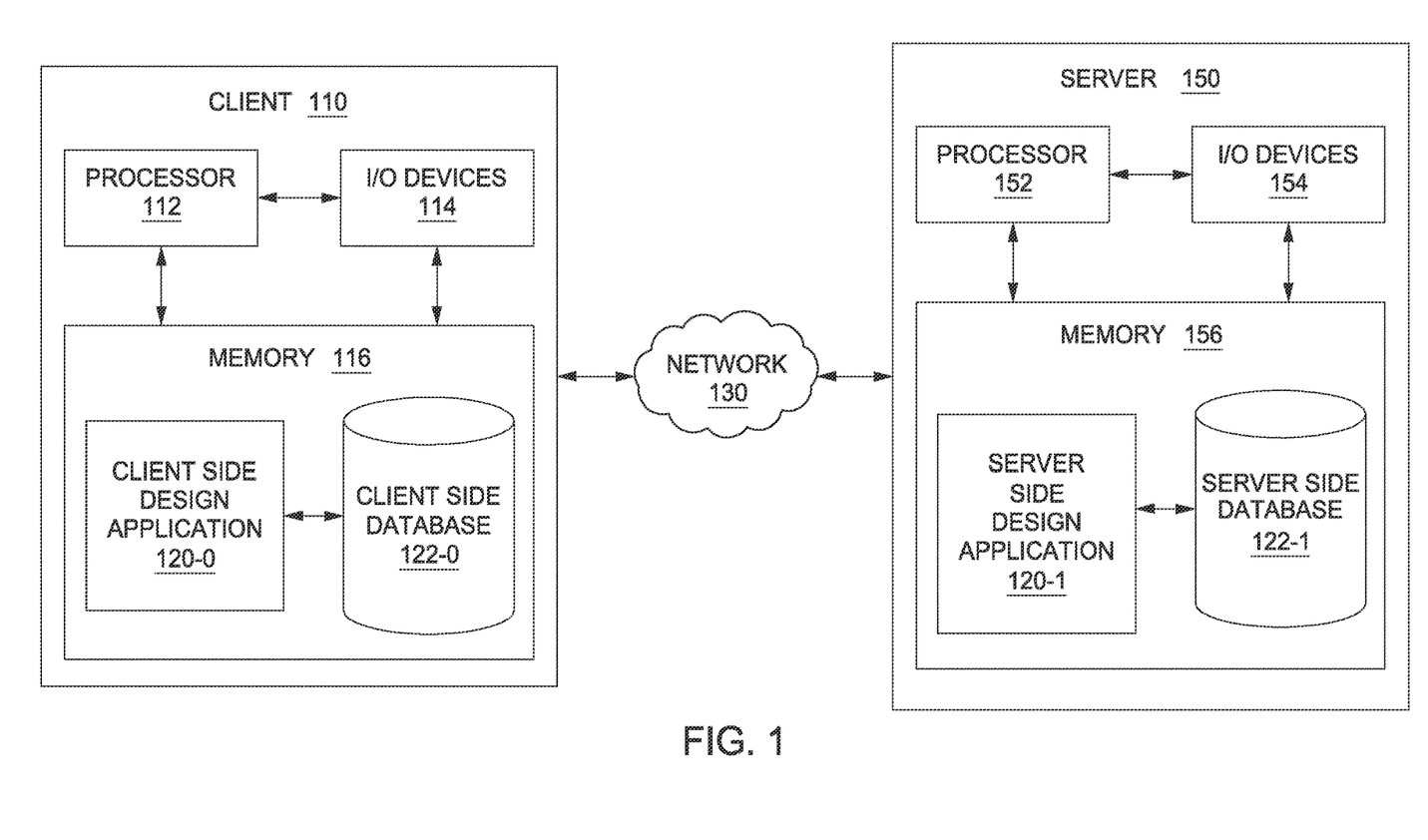
FIG. 1 illustrates a system configured to implement one or more aspects of the present invention.

FIG. 1 illustrates a system 100 configured to implement one or more aspects of the present invention. As shown, system 100 includes, without limitation, a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 generate and modify a design space and to track the evolution of that design space. In doing so, client-side design application 120-0 may store and update data within client-side database 122-0 that reflects the design space as well as changes to that design space over time. Those changes may be implemented via computer-aided design (CAD) tools provided by client-side design application 120-0, or via tools provided by other software applications. Client-side design application 120-0 may also interoperate with a corresponding design application that resides within server 150, and access a database that also resides on server 150, as described in greater detail below.

Server 150 includes processor 152, I/O devices 154, and memory 156, coupled together. Processor 152 may be any technically feasible form of processing device configured process data and execute program code, including a CPU, a GPU, an ASIC, an FPGA, and so forth. I/O devices 114 may include devices configured to receive input, devices configured to provide output, and devices configured to both receive and provide input and output.

Memory 156 may be any technically feasible storage medium configured to store data and software applications, including a hard disk, a RAM module, a ROM, and so forth. Memory 156 includes server-side tracking engine 120-1 and server-side design space database 122-1. Server-side design application 120-1 is a software application that, when executed by processor 152, causes processor 152 generate and modify a design space and to track the evolution of that design space. In doing so, server-side design application 120-1 may store and update data within server-side database 122-1 that reflects the design space as well as changes to that design space over time. Those changes may be implemented via CAD tools provided by server-side design application 120-1 or other types of tools. Server-side design application 120-0 may also interoperate with client-side design application 120-0, and access database 122-0.

In operation, client-side design application 120-0 and server-side design application 120-1 interoperate with one another to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 120-0 and server-side design application 120-1 will be referred to collectively as design application 120. Similarly, client-side database 122-0 and server-side database 122-1 represent different portions of a single distributed storage entity. Therefore, for simplicity, client-side database 122-0 and server-side database 122-1 will be referred to collectively as database 122. Design application 120 and database 122 are described in greater detail below in conjunction with FIG. 2.

Figure 2:
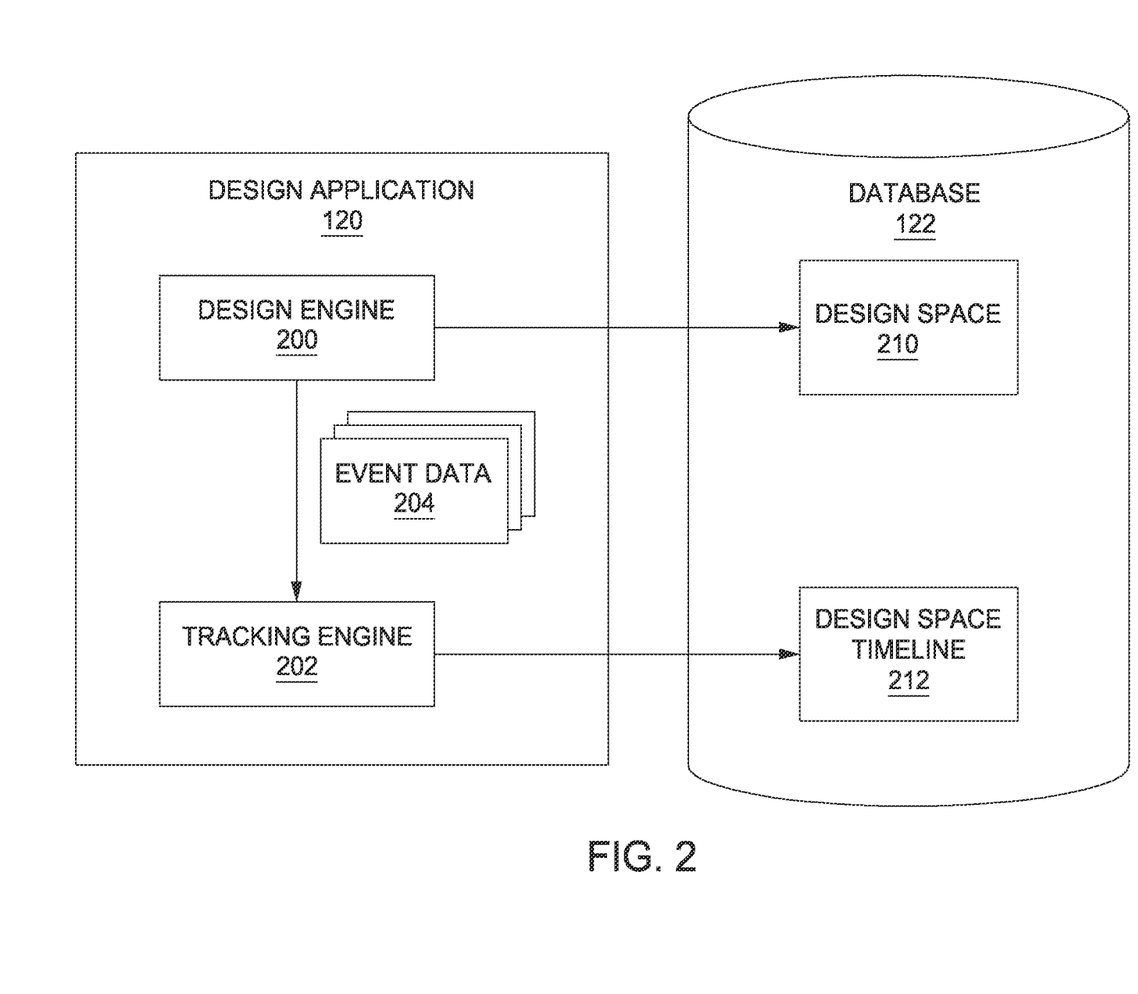
FIG. 2 is a more detailed illustration of the design application of FIG. 1, according to various embodiments of the present invention.

FIG. 2 is a more detailed illustration of the design application of FIG. 1, according to various embodiments of the present invention. As shown, design application 120 includes, without limitation, a design engine 200 and a tracking engine 202, and database 122 includes a design space 210 and a design space timeline 212.

Design engine 200 is a software application that is configured to generate engineering designs. A "design," as referred to herein, may refer to any sort of engineering creation, including a mechanical component, a software program, an assembly of components, a circuit layout, a semiconductor schematic, or any combination thereof. Design engine 200 may include a range of tools for generating any technically feasible type of design. Design engine 200 could be, for example, a computer-aided design (CAD) tool, an engineering simulation program, a software engineering suite, or any other technically feasible software tool or combination of tools that may be used in the context of engineering.

Design engine 200 is configured to generate design space 210 via interactions with one or more end-users. Design space 210 includes any and all information associated with the process of creating a design. For example, design space 210 could include a set of objectives that guide the engineering process, a set of constraints that limit design options, global or local design criteria applicable in the context of the design process, and other factors that drive engineering design. Design space 210 could also include one or more potentially feasible designs, one or more finalized designs, one or more evaluations or analyses performed with any of those designs, simulations of those designs, and so forth. In addition, design space 210 could include more generic types of information, including communications between engineers working towards creating a design (e.g., emails, notes, commit messages, etc.), research related to the generation of a design (e.g., research papers, bookmarked links, academic citations, etc.), documentation associated with the design (e.g., architectural information, technical specifications, etc.).

As one or more end-users interact with design engine 200, design engine 200 generates and updates design space 210. In doing so, design engine 200 may populate design space 210 with a spectrum of possible design options, as mentioned above. As those end-users continue to interact with design engine 200, design engine 200 may narrow or expand that spectrum of possible designs over time based on various design choices made by those end-users. Further, as the end-users generate additional information related to the design process, design engine 120 may include this information in design space 210. When the end-users perform any set of actions that causes changes to be applied to design space 210, design engine 200 transmits event data 204 to tracking engine 202.

Event data 204 reflects changes made to design space 210. For example, if an end-user modifies a portion of program code from a code listing in design space 210, design engine 200 would transmit event data 204 that reflects that modification. In another example, if an end-user changes a set of constraints associated with design space 210, thereby causing the spectrum of design options to change, design engine 200 would transmit event data 204 to reflect that change in constraints and the corresponding change in design options. In one embodiment, event data 204 reflects input generated by an end-user and then provided directly to tracking engine 202, including, for example, interactions with design space timeline 212.

Tracking engine 202 is configured to receive event data 204 from design engine 200 continuously over time, as changes are applied to design space 210, and to record those changes in design space timeline 212. Design space timeline 212 includes data that may be used to illustrate the evolution of design space 210 over time. Tracking engine 202 and design space timeline 212 are described in greater detail below in conjunction with FIG. 3.

Figure 3:
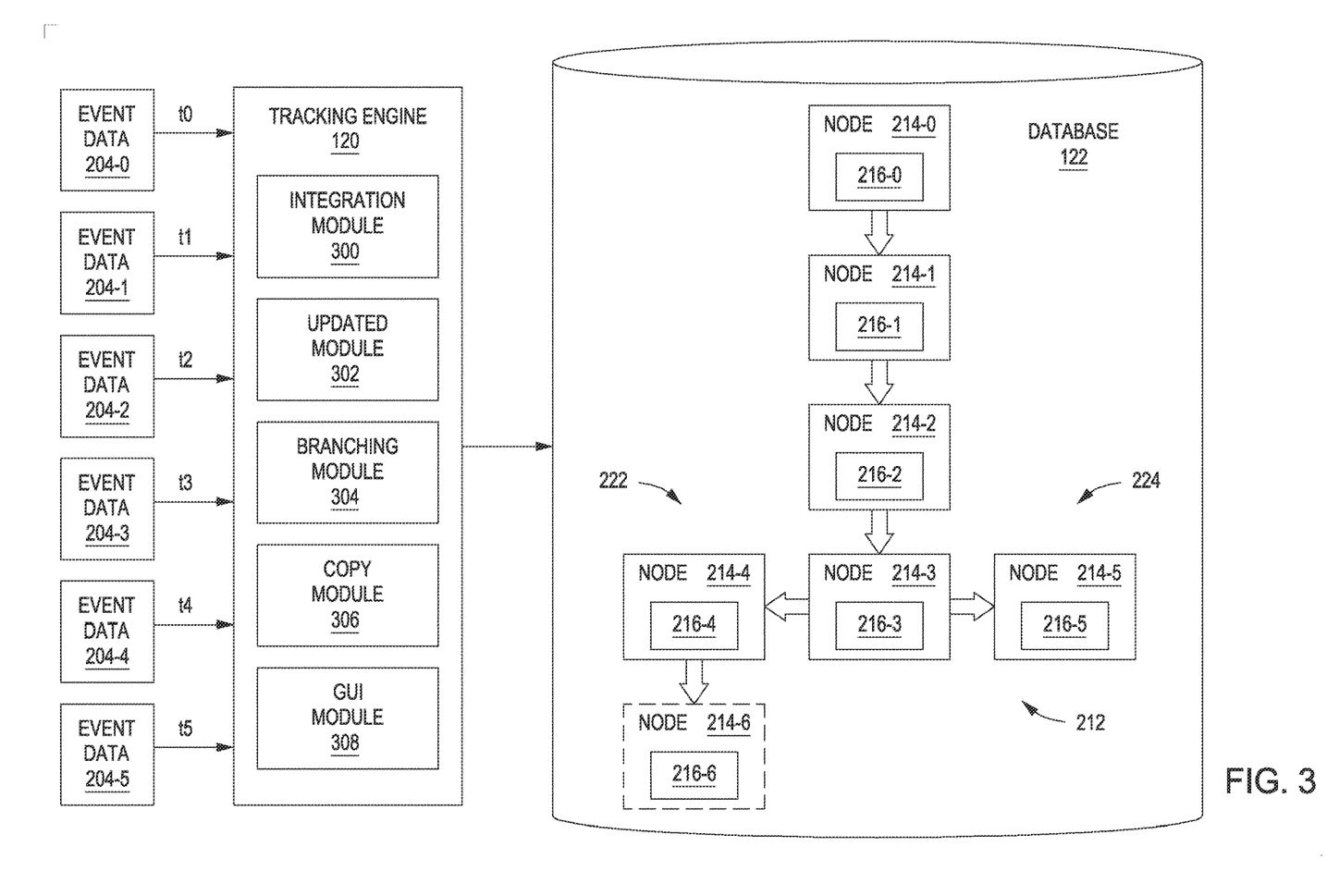
FIG. 3 is a more detailed illustration of how the tracking engine of FIG. 2 tracks the evolution of an exemplary design space, according to various embodiments of the present invention.

FIG. 3 is a more detailed illustration of how the tracking engine of FIG. 2 tracks the evolution of an exemplary design space, according to various embodiments of the present invention. As shown, tracking engine 202 includes, without limitation, an integration module 300, an update module 302, a branching module 304, a copy module 306, and a graphical user interface (GUI) module 308. As also shown, database 122 includes nodes 214-0 through 214-6 of design space timeline 212. Each node 214 includes representation data 216. The various modules within tracking engine 202 are configured to receive and process event data 204, and to then generate and update nodes 214 and representation data 216 of design space timeline 214. These operations are described in greater detail below in conjunction with an exemplary evolution of design space 210 from time t0 though time t5 through a corresponding sequence of states. This exemplary evolution is also illustrated in greater detail below in conjunction with FIGS. 4A-4F.

At time t0, tracking engine 202 receives event data 204-0. In this example, event data 204-0 reflects a single change to design space 210 made by an end-user or a sequence of related changes to design space 210 made by one or more end-users. Based on event data 204-0, integration module 300 generates node 214-0 and representation data 216-0 within design space timeline 212. Node 214-0 reflects the state of design space 210 after the changes associated with event data 204-0 are applied to design space 210. Representation data 216-0 includes a graphical depiction of those changes. GUI module 308 is configured to generate a visual representation of design space timeline 212 that reflects the addition of node 214-0, as described in greater detail below in conjunction with FIG. 4A.

At time t1, tracking engine 202 receives event data 204-1. Similar to event data 204-0, event data 204-1 reflects a single change or a collection of changes made to design space 210. Integration module 300 generates node 214-1 and corresponding representation data 216-1, and integrates that node into design space timeline 212. GUI module 308 may update a visual representation of design space timeline 212 based on the addition of node 214-1. At this point in time, design space timeline represents the evolution of design space 210 from a first state associated with time t0 to a second state associated with time t1. GUI module 308 is configured to generate a visual representation of design space timeline 212 that reflects the addition of node 214-1, as described in greater detail below in conjunction with FIG. 4B.

At time t2, tracking engine 202 receives event data 204-2. Similar to event data 204-0 and 204-1, event data 204-2 reflects a single change or a collection of changes made to design space 210. Integration module 300 generates node 214-2 to reflect the state of design space 210 at time t2, and also generates corresponding representation data 216-2, then integrates that node into design space timeline 212. GUI module 308 may then update a visual representation of design space timeline 212 based on the addition of node 214-2, as described in greater detail below in conjunction with FIG. 4C.

At any point in time, tracking engine 202 may remove nodes 214 from design space timeline 212 based on user input. For example, an end-user could select node 214-1 for removal. Integration module 300 would then delete node 214-1, and update module 302 would then update any nodes 214 downstream of the removed node to account for design space changes associated with node 214-1 no longer being integrated into design space timeline 212. For example, suppose node 214-1 reflects a specific constraint applied to design space 210 that limits a spectrum of design options. Node 214-2, which resides downstream of node 214-1, would reflect that limited spectrum of design options. However, with the removal of node 214-1, that constraint would no longer be applied to node 214-2, and so the spectrum of design options associated with node 214-2 could be expanded. FIG. 4D illustrates the above-described node removal in greater detail.

At time t3, tracking engine 202 receives event data 204-3. Event data 204-3 represents a branching operation performed by an end-user with tracking engine 202. In performing this branching operation, branching module 304 inserts node 214-3 into design space timeline 212. Design space timeline 212 splits into branch 222 and 224 downstream of node 214-3. Tracking engine 202 allows end-users to create branches in this manner in order to facilitate the exploration of different related sub-spaces within design space 210. For example, an end-user could wish to explore the consequences of making a particular design choice, and, in parallel, explore the consequences of making a different design choice. GUI module 308 is configured to generate a visual representation of design space timeline 212 that reflects the addition of node 214-3, as described in greater detail below in conjunction with FIG. 4E.

At time t4, tracking engine 202 receives event data 204-4. Event data 204-4 reflects one or more changes made to branch 222 of design space 210. Integration module 300 generates node 214-4 based on event data 204-4, and includes that node downstream of branching node 214-3, along branch 222 of design space timeline 212.

At time t5, tracking engine 202 receives event data 204-5. Event data 204-5 reflects one or more changes made to branch 224 of design space 210. Integration module 300 generates node 214-5 based on event data 204-5, and includes that node downstream of branching node 214-5, along branch 224 of design space timeline 212.

Branches 222 and 224, including nodes 214-4 and 214-5, respectively, thus represent parallel evolutionary pathways of design space 210. An end-user may select one branch of design space timeline 212, and perform additional changes with design space 210, in order to explore potential design options associated with that branch. An end-user may also select the other branch of design space timeline 212 and perform changes to explore potentially different design options.

Tracking engine 202 is further configured to copy nodes 214 between branches based on end-user input. This functionality may permit an end-user to observe the effects of changes associated with copied nodes on other branches of design space timeline 212. In FIG. 3, node 214-5 is copied from branch 224 to node 214-6 within branch 222. To effect this copy operation, copy module 306 and integration module 300 operate in conjunction with one another to generate node 214-6 based on node 214-5, and then integrate that new node into branch 222 of design space timeline 212.

In one embodiment, tracking engine 202 may interoperate with design engine 200 in order to update design space 210, based on changes made to design space timeline 212. Thus, design space timeline 212 may be configured to both track the evolution of design space 210 and allow end-users to modify that evolution via interactions with design space timeline 212.

Persons skilled in the art will understand that event data 204 and nodes 214 of design space timeline 212 are presented for illustrative purposes only. As a general matter, design engine 200 may generate any type of event data to reflect changes made to design space 210, and tracking engine 202 may generate any number and combination of nodes 214 to codify those changes in design space timeline 212, thereby tracking design space 210 through a series of states and changes between those states.

FIGS. 4A-4F set forth a visual representation of an exemplary design space timeline that evolves in conjunction with a changing design space, according to various embodiments of the present invention. Each one of FIGS. 4A-4F illustrates design space timeline 212 at a different point in time from t0 through t6 described above in conjunction with FIG. 3.

Figure 4A:
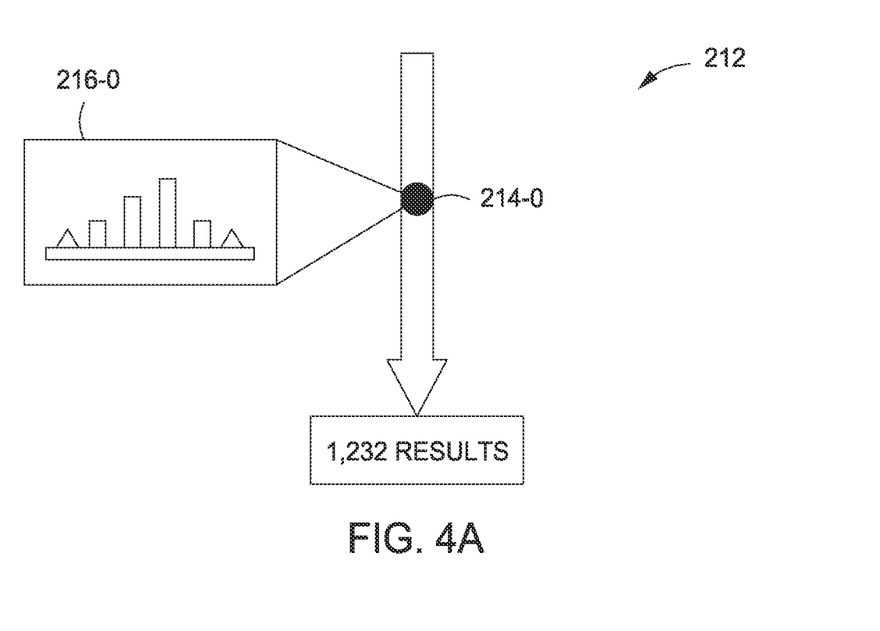
FIGS. 4A-4F set forth a visual representation of an exemplary design space timeline that evolves in conjunction with a changing design space, according to various embodiments of the present invention.

As shown in FIG. 4A, design space 212 includes node 214-0 and corresponding representation 216-0. Representation 216-0 visually depicts one or more changes applied to design space 210 at time t0 by one or more end-users. GUI module 308 generates the visual representation of design space timeline 212 shown in FIG. 4A in response to the addition of node 214-0. GUI module 308 may also display the number of potential design options associated with design space 210 at time to.

Figure 4B:
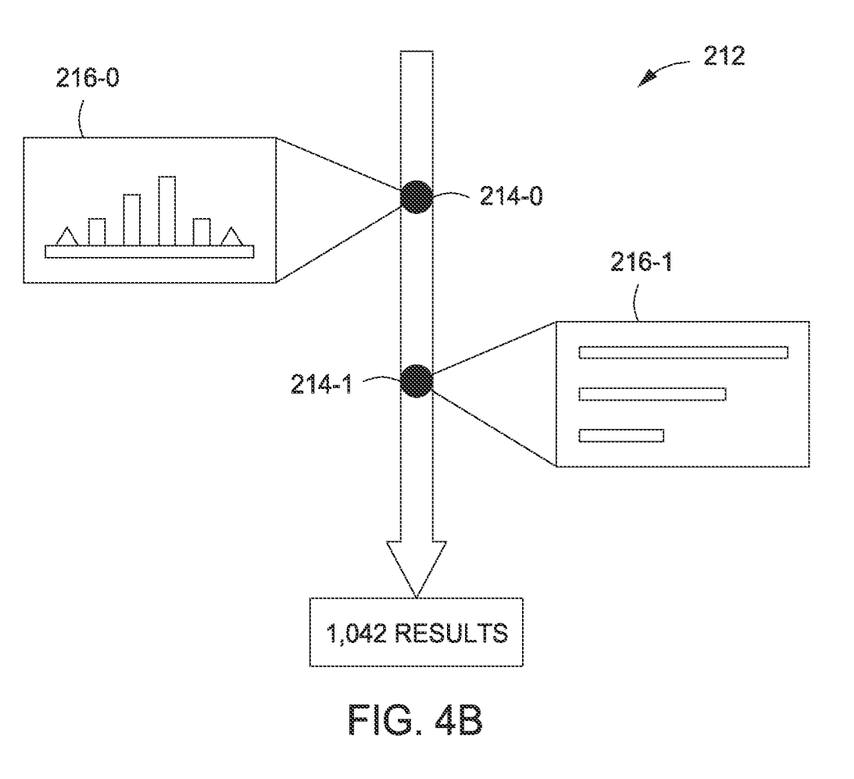

As shown in FIG. 4B, design space 212 now includes node 214-1 and corresponding representation 216-1. Representation 216-1 visually depicts one or more changes applied to design space 210 at time t1 by one or more end-users. GUI module 308 updates the visual representation of design space timeline 212, as shown in FIG. 4B, in response to the addition of node 214-1.

Figure 4C:
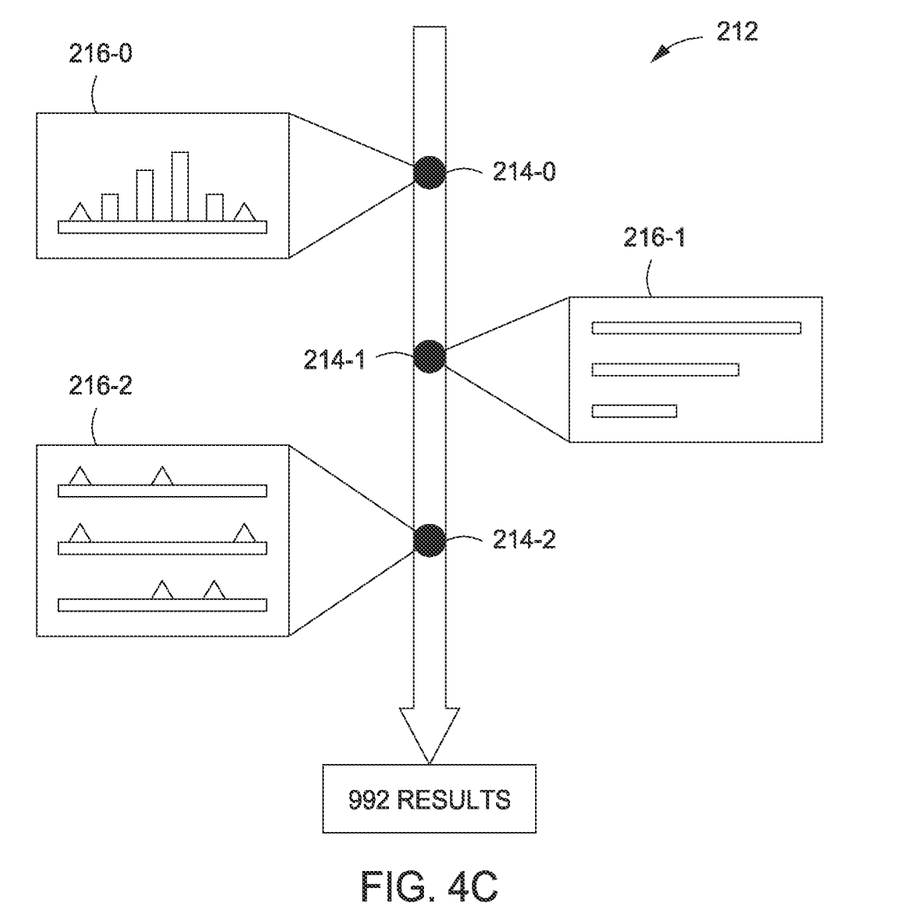
Figure 4D:
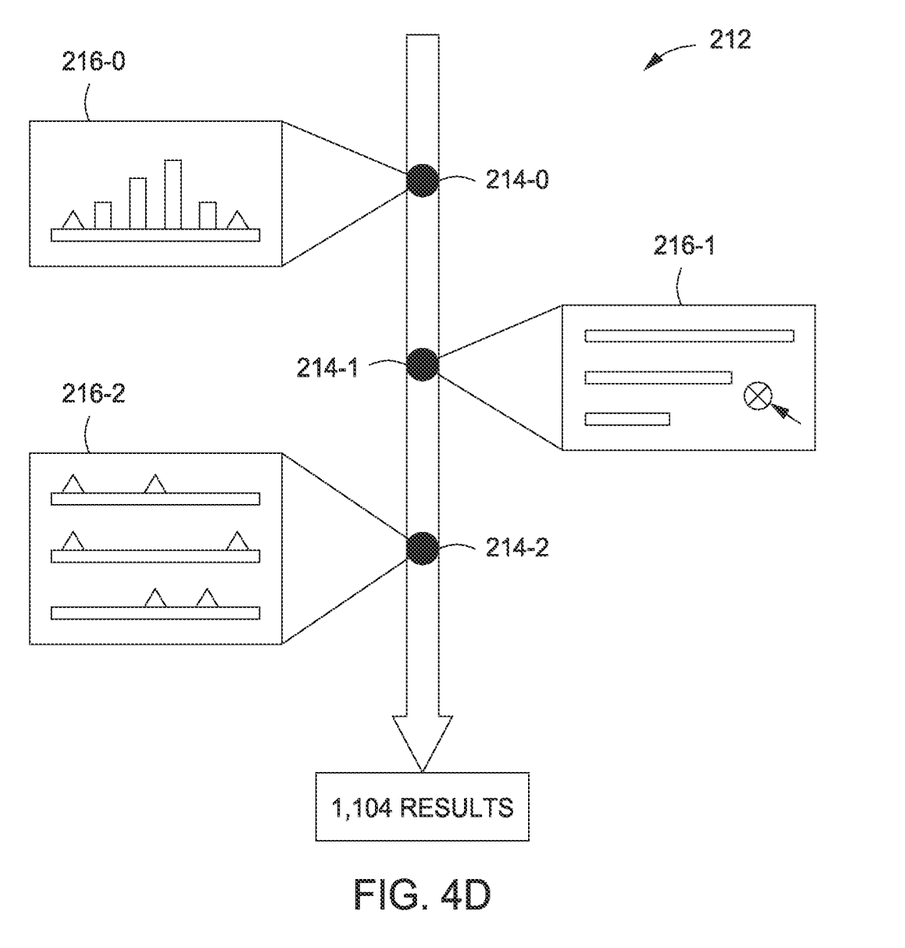

As shown in FIG. 4C, design space 212 now includes node 214-2 and corresponding representation 216-2. Representation 216-2 visually depicts one or more changes applied to design space 210 at time t2 by one or more end-users. GUI module 308 updates the visual representation of design space timeline 212, as shown in FIG. 4C, in response to the addition of node 214-2.

As shown in FIG. 4D, node 216-1 is removed from design space timeline 212 based on user input. In response, integration module 300 deletes node 214-1 and corresponding representation 216-1, and update module 302 then updates node 214-1, thereby allowing the spectrum of design options to be expanded. GUI module 308 updates the visual representation of design space timeline 212, as shown in FIG. 4D, in response to the removal of node 214-1.

Figure 4E:
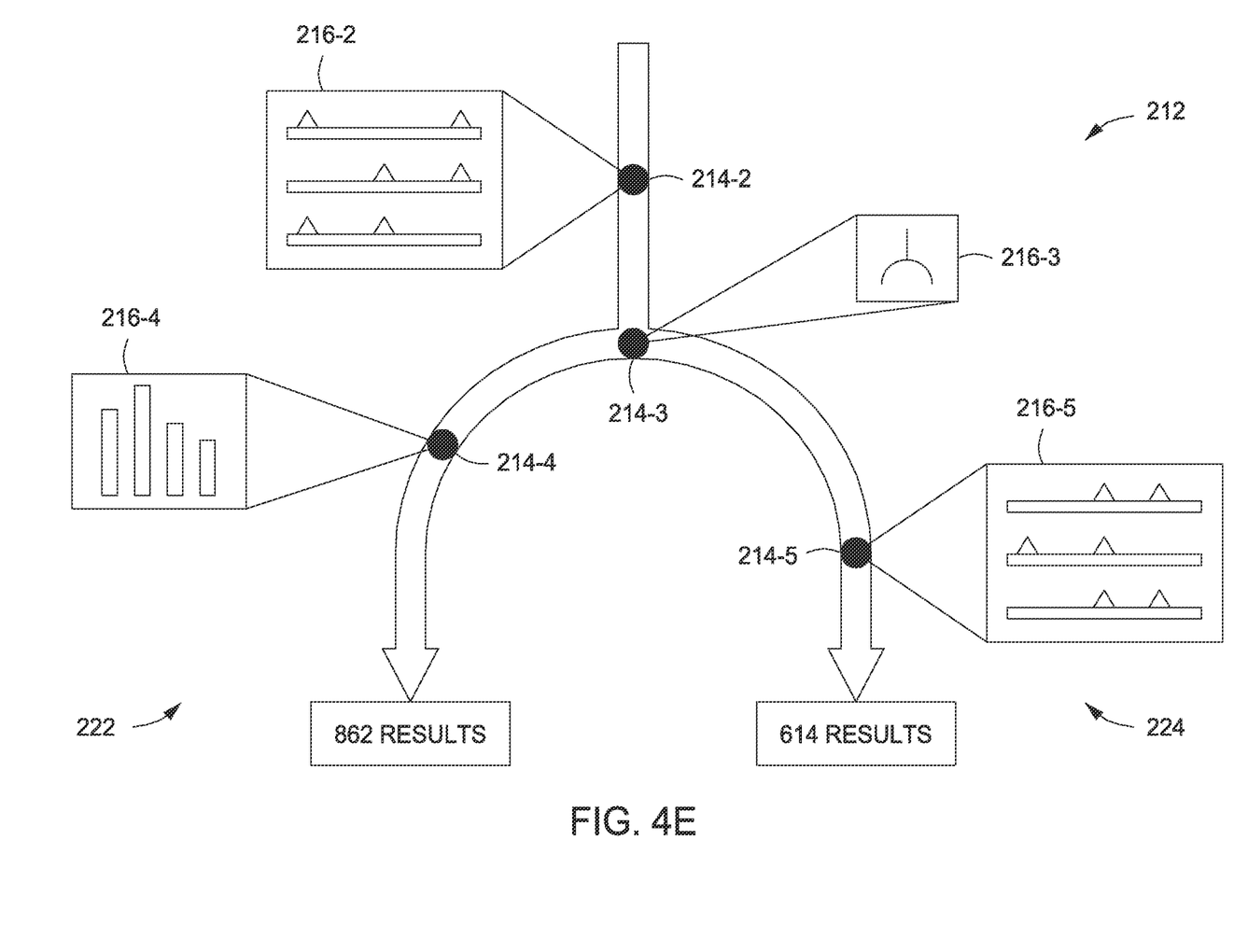

As shown in FIG. 4E, design space 212 now includes nodes 214-3, 214-4, and 214-5. Nodes upstream of node 214-2 are no longer shown, for clarity. Node 214-3 represents a branching node introduced by branching module 304 in response to end-user input. Downstream of node 214-3, design space timeline 212 splits into branches 222 and 224. Branch 222 includes node 214-4, shown with representation 216-4, and branch 224 includes node 214-5, shown with representation 216-5. Branches 222 and 224, including nodes 214-5 and 214-6, respectively, represent parallel evolutionary pathways of design space 210. An end-user may select one branch of design space timeline 212, and perform additional changes with design space 210, in order to explore potential design options associated with that branch. An end-user may also select the other branch of design space timeline 212 and perform changes to explore potentially different design options. GUI module 308 updates the visual representation of design space timeline 212, as shown in FIG. 4E, in response to the addition of nodes 214-3, 214-4, and 214-5.

Figure 4F:
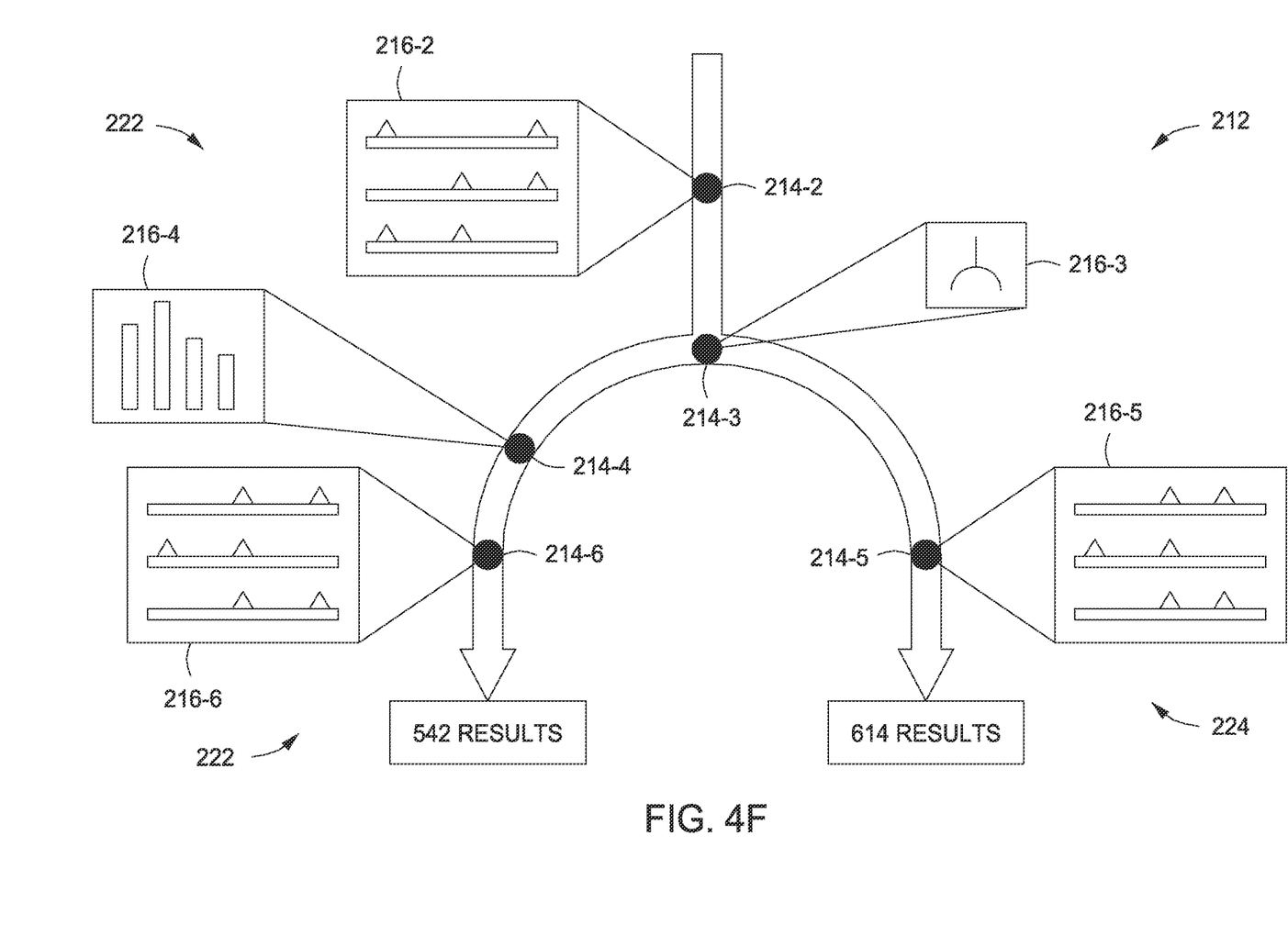

As shown in FIG. 4F, design space 212 now includes node 214-6. Copy module 306 copies node 214-5 to generate node 214-6, and then integration module 300 integrates that copied node into branch 222 of design space timeline 212. This copying functionality may permit an end-user to observe the effects of changes associated with copied nodes on other branches of design space timeline 212. GUI module 308 updates the visual representation of design space timeline 212, as shown in FIG. 4F, in response to the copying of node 214-5 to node 214-6.

Referring generally to FIGS. 4A-4F, the visualizations shown in these figures are presented for illustrative purposes only to demonstrate how GUI module 308 displays design space timeline 212 to end-users in response to tracking engine 202 receiving event data 204-0 through 204-5. In practice, tracking engine 202 may receive any type and number of different event data 204, and generate a corresponding design space timeline for display. The overall functionality of tracking engine 202 is described more generically below in conjunction with FIGS. 5-6.

Figure 5:
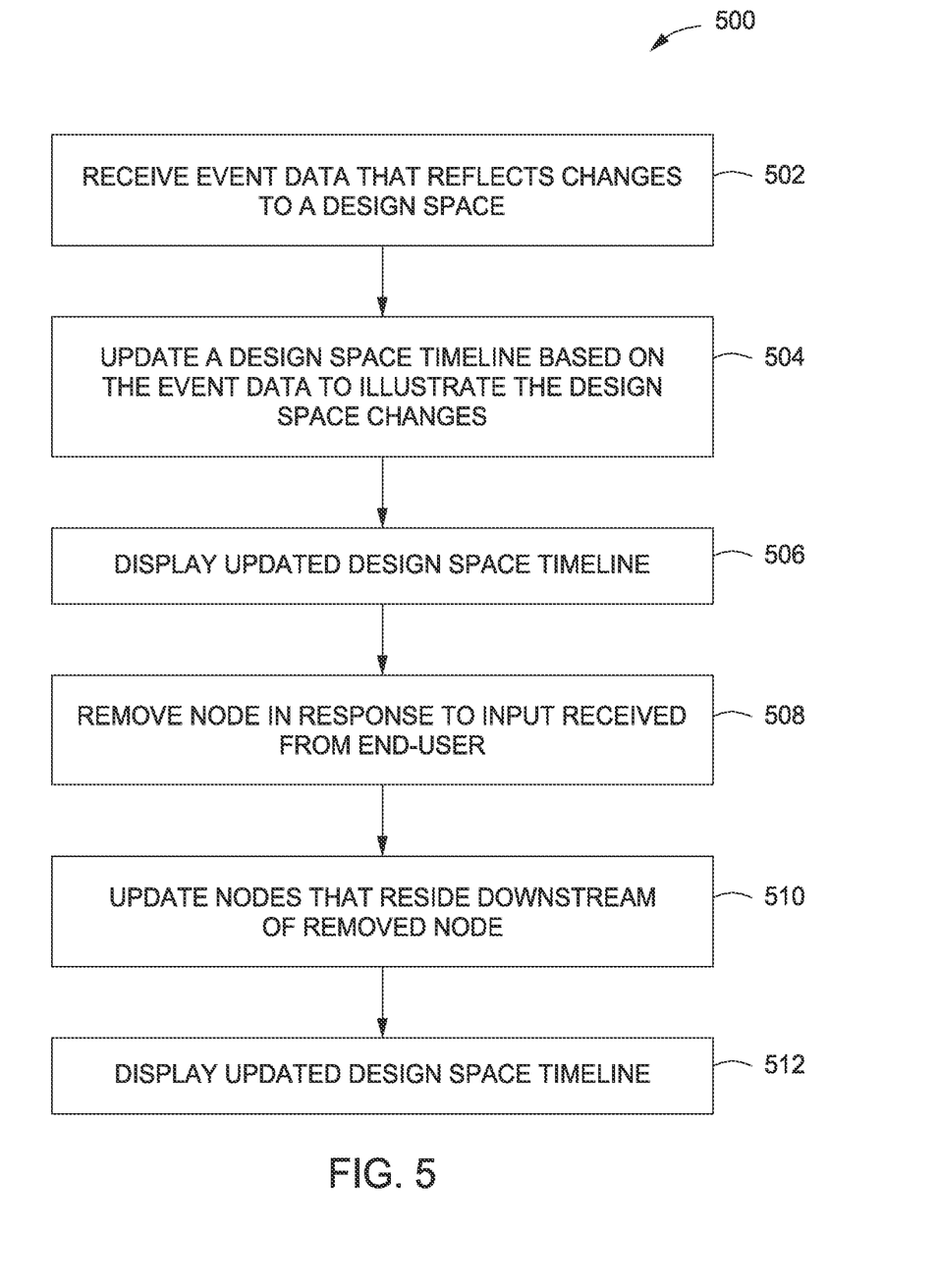
FIG. 5 is a flow diagram of method steps for generating a design space timeline, according to various embodiments of the present invention.

FIG. 5 is a flow diagram of method steps for generating a design space timeline, according to various embodiments of the present invention. Although the method steps are described in conjunction with the systems of FIGS. 1-4F, persons skilled in the art will understand that any system configured to perform the method steps, in any order, is within the scope of the present invention.

As shown, a method 500 begins at step 502, where tracking engine 202 within design engine 120 receives event data 204. Event data 204 reflects changes to design space 210. Design engine 200 transmits event data 204 to tracking engine 202 when such changes occur. For example, if an end-user modified a portion of program code from a code listing in design space 210, design engine 200 would transmit event data 204 that reflects that modification.

At step 504, integration module 300 within tracking engine 202 updates design space timeline 212 based on event data 204 to illustrate changes to design space 210. In doing so, integration module 300 adds one or more nodes 314, as needed, to reflect the changes indicated by event data 204, and stores these added nodes in database 122.

At step 506, GUI module 308 renders an updated representation of design space timeline 212. GUI module 308 may detect changes in design space timeline 212, and then re-render that timeline, or simply update an existing rendering to show the detected changes. In doing so, GUI module 308 causes a display device to display the rendered version of design space timeline 212.

At step 508, integration module 300 removes one or more nodes 214 from design space timeline 212 in response to end-user input. An end-user may indicate that nodes 214 should be removed from design space timeline 212 via interaction with design space timeline 212. At step 510, update module 302 updates nodes 214 that reside downstream of the removed node. As an example of steps 508 and 510, an end-user could select node 214-1 for removal. Integration module 300 would then delete node 214-1, and update module 302 would then update any nodes 214 downstream of the removed node to account for design space changes associated with node 214-1 no longer being integrated into design space timeline 212.

At step 512, GUI module 308 renders an updated representation of design space timeline 212 that reflects the removal of the node and the updates applied to any downstream nodes.

By implementing the method 500, tracking engine 202 is configured to receive event data 204 from design engine 200 continuously over time, as changes are applied to design space 210, and to record those changes in design space timeline 212. Tracking engine 202 may perform other operations based on event data as well, as described below in conjunction with FIG. 6.

Figure 6:
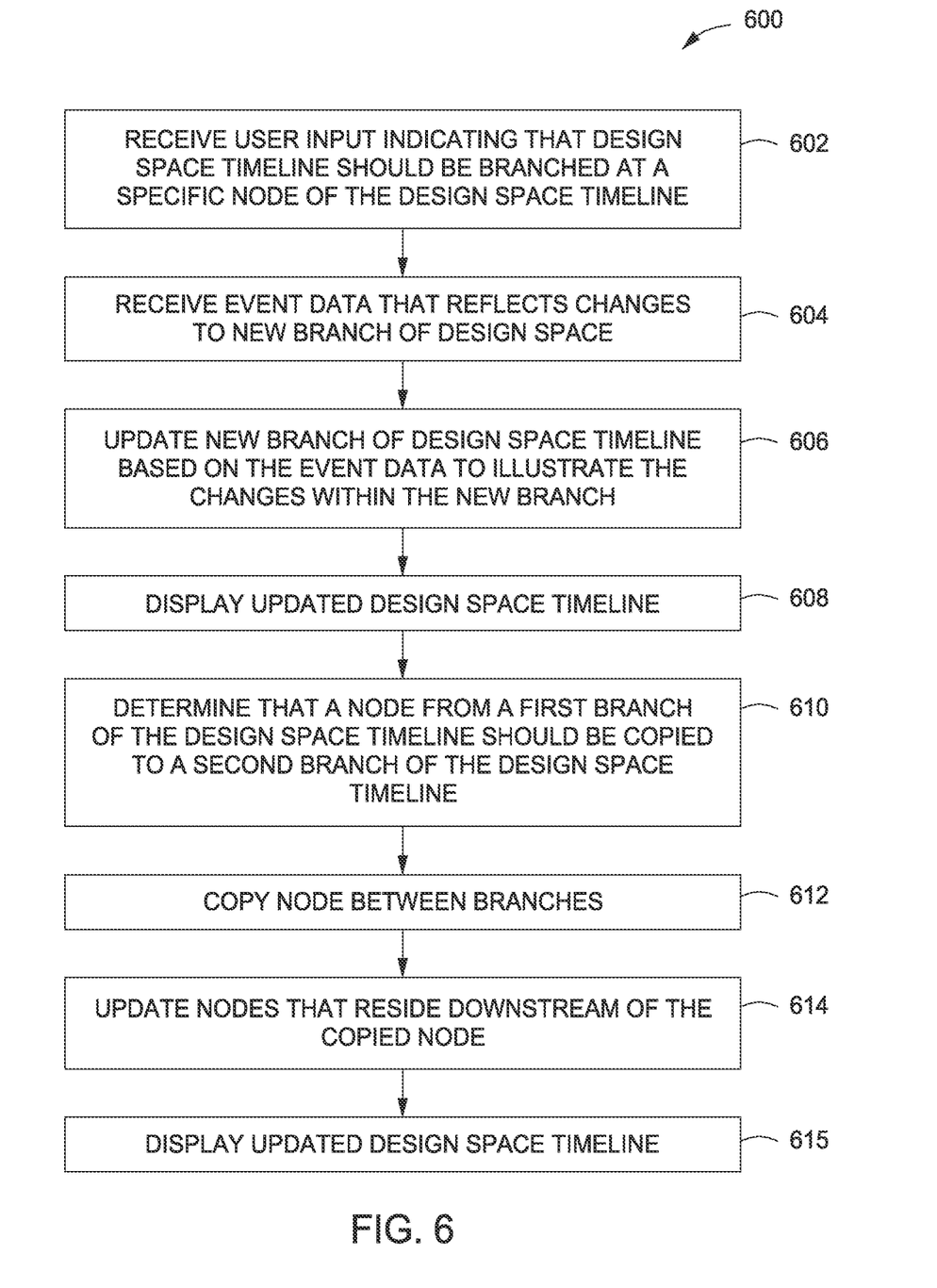
FIG. 6 is a flow diagram of method steps for generating a branching design space timeline, according to various embodiments of the present invention.

FIG. 6 is a flow diagram of method steps for generating a branching design space timeline, according to various embodiments of the present invention. Although the method steps are described in conjunction with the systems of FIGS. 1-4F, persons skilled in the art will understand that any system configured to perform the method steps, in any order, is within the scope of the present invention.

As shown, a method 600 begins at step 602, where tracking engine 202 receives event data 204 indicating that design space timeline 212 should be branched. In response, branching module 304 within tracking engine 202 generates a node 214 and includes the node 214 within design space timeline 212. Downstream of the newly-added node, design space timeline branches into two or more branches. Tracking engine 202 allows end-users to create branches in this manner in order to facilitate the exploration of different related sub-spaces within design space 210. For example, an end-user could wish to explore the consequences of making a particular design choice, and, in parallel, explore the consequences of making a different design choice.

At step 604, tracking engine 202 receives additional event data 204 that reflects changes to one of the new branches of design space timeline 212. For example, tracking engine 202 could receive event data 204-5 that represents changes to branch 224 of design space timeline 212. At step 606, integration module 300 generates a node 214 that reflects the received event data 204, and integrates that node into design space timeline 212. At step 608, GUI module 308 generates and displays an updated version of design space timeline 212.

At step 610, tracking engine 202 determines that a node from a first branch of design space timeline 212 should be copied to a second branch of design space timeline 212. Tracking engine 202 supports copying functionality to permit an end-user to observe the effects of changes associated with copied nodes on other branches of design space timeline 212. For example, in FIG. 3, node 214-5 is copied from branch 224 to node 214-6 within branch 222.

At step 612, copy module 306 and integration module 300 operate in conjunction with one another to copy the node from the first branch to the second branch. In doing so, copy module 306 generates a new node based on the node to be copied, and then integration module 300 integrates that new node into the second branch of design space timeline 212.

At step 614, update module 302 updates nodes 214 that reside downstream of the new node. Update module 302 analyzes the newly added node and adapts downstream nodes to reflect design choices associated with the newly added node. For example, suppose the added node 214 reflects a specific constraint applied to design space 210 that limits a spectrum of design options. Update module 302 would update nodes residing downstream of the newly added node to reflect this new constraint. At step 616, GUI module 308 displays an updated representation of design space timeline that shows the copied node and the updated nodes residing downstream.

Referring generally to FIG. 5-6, persons skilled in the art will understand that tracking engine 202 may perform the methods 500 and 600 in conjunction with one another to generate design space timeline 212 and to effect modifications to that timeline.

In sum, a design application includes a design engine and a tracking engine. The design engine allows end-users to create and modify a design space. The design space includes a spectrum of possible design options, as well as other information related to the process of creating designs. When changes are applied to the design space, the design engine transmits event data to the tracking engine that reflects those changes. The tracking engine, based on the event data, updates a design space timeline. The design space timeline illustrates the evolution of the design space over time.

At least one advantage of the disclosed techniques is that the tracking engine records the overall process of generating a successful design. Thus, end-users can analyze the process of creating a successful design, and then implement a similar process to create other successful designs.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media storing program instructions that, when executed by one or more processors, cause the one or more processors to generate a design space timeline, by performing the steps of:
    generating a first node associated with a first graphical depiction of a first state of a design space after a first set of modifications is made to the design space, wherein the design space comprises a plurality of potential design options that solve a design problem;
    integrating the first node and the first graphical depiction into the design space timeline that is displayed via a graphical user interface;
    generating a second node associated with a second graphical depiction of a second state of the design space after the first set of modifications and a second set of modifications is made to the design space;
    integrating the second node and the second graphical depiction into the design space timeline;
    in response to removing the first node from the design space timeline, updating the second node to be associated with a third graphical depiction of a third state of the design space that reflects the second set of modifications made to the design space but does not reflect the first set of modifications made to the design space, and
    integrating the third graphical depiction into the design space timeline.

2. The one or more non-transitory computer-readable media of claim 1, further comprising:
    determining that the design space timeline is to be branched downstream of the second node;
    generating a third node that indicates a branching point in the design space timeline;
    integrating the third node into the design space timeline that illustrates the design space branching into at least two parallel branches.

3. The one or more non-transitory computer-readable media of claim 2, further comprising:
    generating a fourth node associated with a fourth graphical depiction of a fourth state of the design space after a third set of modifications is made to the design space; and
    integrating the fourth node and the fourth graphical depiction into a first branch of the design space timeline that illustrates one or more modifications of the design space along the first branch of the design space timeline.

4. The one or more non-transitory computer-readable media of claim 2, further comprising:
    determining that a fourth node is to be copied from a first branch of the design space timeline to a second branch of the design space timeline; and
    copying the fourth node to the second branch of the design space timeline that illustrates one or more modifications of the design space along the first branch of the design space timeline and along the second branch of the design space timeline.

5. The one or more non-transitory computer-readable media of claim 1, wherein the design space timeline indicates a quantity of potential design options in the plurality of potential design options.

6. The one or more non-transitory computer-readable media of claim 1, further comprising applying one or more modifications to the design space based on one or more modifications made to the design space timeline.

7. The one or more non-transitory computer-readable media of claim 1, further comprising receiving first event data that includes the first set of modifications, wherein the step of generating the first node occurs in response to receiving the first event data.

8. The one or more non-transitory computer-readable media of claim 1, wherein the design problem comprises at least one of a set of objectives, a set of constraints, and a set of design criteria.

9. The one or more non-transitory computer-readable media of claim 1, wherein the design problem comprises a set of constraints that limit the plurality of potential design options of the design space.

10. The one or more non-transitory computer-readable media of claim 1, wherein:
    the first set of modifications and the second set of modifications each modify the design problem;
    the design space in the second state comprises a plurality of potential design options that solve the design problem as modified by the first set of modifications and the second set of modifications; and
    the design space in the third state comprises a plurality of potential design options that solve the design problem as modified by the second set of modifications and not the first set of modifications.

11. The one or more non-transitory computer-readable media of claim 1, wherein:
    the first set of modifications add a first constraint to the design problem that limit the plurality of potential design options of the design space;
    the design space in the second state comprises a first number of potential design options; and
    the design space in the third state comprises a second number of potential design options, the second number being greater than the first number.

12. A computer-implemented method for generating a design space timeline, the method comprising:
    generating a first node associated with a first graphical depiction of a first state of a design space after a first set of modifications is made to the design space, wherein the design space comprises a plurality of potential design options that solve a design problem;

integrating the first node and the first graphical depiction into the design space timeline that is displayed via a graphical user interface;

generating a second node associated with a second graphical depiction of a second state of the design space after the first set of modifications and a second set of modifications is made to the design space;

integrating the second node and the second graphical depiction into the design space timeline;

in response to removing the first node from the design space timeline, updating the second node to be associated with a third graphical depiction of a third state of the design space that reflects the second set of modifications made to the design space but does not reflect the first set of modifications made to the design space, and integrating the third graphical depiction into the design space timeline.

13. The computer-implemented method of claim 12, further comprising:

determining that the design space timeline is to be branched downstream of the second node;

generating a third node that indicates a branching point in the design space timeline;

integrating the third node into the design space timeline that illustrates the design space branching into at least two parallel branches.

14. The computer-implemented method of claim 13, further comprising:

generating a fourth node associated with a fourth graphical depiction of a fourth state of the design space after a third set of modifications is made to the design space; and integrating the fourth node and the fourth graphical depiction into a first branch of the design space timeline that illustrates one or more modifications of the design space along the first branch of the design space timeline.

15. The computer-implemented method of claim 13, further comprising:

determining that a fourth node is to be copied from a first branch of the design space timeline to a second branch of the design space timeline; and copying the fourth node to the second branch of the design space timeline that illustrates one or more modifications of the design space along the first branch of the design space timeline and along the second branch of the design space timeline.

16. The computer-implemented method of claim 12, further comprising applying one or more modifications to the design space based on one or more modifications made to the design space timeline.

17. A system for generating a design space timeline, comprising:

a memory storing a design application; and a processor that, when executing the design application, is configured to:

generate a first node associated with a first graphical depiction of a first state of a design space after a first set of modifications is made to the design space, wherein the design space comprises a plurality of potential design options that solve a design problem, integrate the first node and the first graphical depiction into the design space timeline that is displayed via a graphical user interface, generate a second node associated with a second graphical depiction of a second state of the design space after the first set of modifications and a second set of modifications is made to the design space, integrate the second node and the second graphical depiction into the design space timeline;

in response to removing the first node from the design space timeline, update the second node to be associated with a third graphical depiction of a third state of the design space that reflects the second set of modifications made to the design space but does not reflect the first set of modifications made to the design space, and integrate the third graphical depiction into the design space timeline.

18. The system of claim 17, wherein the processor if further configured to:

determine that the design space timeline is to be branched downstream of the second node;

generate a third node that indicates a branching point in the design space timeline;

integrate the third node into the design space timeline that illustrates the design space branching into at least two parallel branches.

* * * * *